United States Patent
Jeng et al.

(10) Patent No.: US 6,168,987 B1
(45) Date of Patent: Jan. 2, 2001

(54) METHOD FOR FABRICATING CROWN-SHAPED CAPACITOR STRUCTURES

(75) Inventors: Erik S. Jeng, Taipei; Ing-Ruey Liaw, Hsinchu; Rong-Wu Chien, Chyai, all of (TW)

(73) Assignee: Vanguard International Semiconductor Corp., Taipei (TW)

( * ) Notice: Under 35 U.S.C. 154(b), the term of this patent shall be extended for 0 days.

(21) Appl. No.: 08/630,013

(22) Filed: Apr. 9, 1996

(51) Int. Cl.[7] .................................................. H01L 21/8242
(52) U.S. Cl. ................................................ 438/253; 438/254
(58) Field of Search ............. 437/52, 919; 438/250–256, 438/393–396

(56) References Cited

U.S. PATENT DOCUMENTS

| | | | |
|---|---|---|---|
| 5,145,801 | * 9/1992 | Chhabra | 437/52 |
| 5,185,282 | 2/1993 | Lee et al. | 437/47 |
| 5,284,787 | * 2/1994 | Ahn | 438/253 |
| 5,346,844 | * 9/1994 | Cho et al. | 438/253 |
| 5,478,772 | * 12/1995 | Fazan | 437/52 |
| 5,597,755 | * 1/1997 | Ajika et al. | 437/52 |
| 5,608,247 | * 3/1997 | Brown | 257/306 |

* cited by examiner

Primary Examiner—Jey Tsai

(74) Attorney, Agent, or Firm—Nath & Associates; Harold L. Novick

(57) ABSTRACT

The memory cell, such as a DRAM, has a crown-shaped capacitor structure and is formed on a substrate having a first conductivity type (i.e., p-type) and preferably has the following structure. Portions of the substrate are doped to have a conductivity type opposite that of the substrate (i.e, n-type) to form drain and source regions. A gate is formed between the drain and source regions having a gate oxide adjacent the substrate, a first polysilicon region (Poly-1), tungsten silicide layer, and an oxide layer and $Si_yN_x$, respectively, on the gate oxide. $Si_yN_x$ spacers cover the sides of the gate regions. Above the oxide layer are tetetraethylorthosilicate (TEOS) and borophosphosilicate (BPSG) layers. A second polysilicon layer (Poly-2) is patterned to form a bitline which contacts the source region. A layer of tungsten silicide, oxide, and $Si_yN_x$ are formed on top of the bitline. $Si_yN_x$ spacers surround the bitline. A crown-shaped capacitor contacts the drain region. The crown-shaped capacitor comprises two polysilicon electrodes (Poly-3, Poly-4) separated by a thin dielectric layer. The inventive method fabricates the DRAM cell using only five masking steps. Thus, the process is more efficient than the prior art method for fabricating other DRAMS having crown-shaped capacitors. Also, the drain is exposed at the same time that the grid is formed using $Si_yN_x$ spacers for etch self-alignment. This avoids precise masking or photolithography to expose this layer.

11 Claims, 6 Drawing Sheets

METHOD FOR FABRICATING CROWN-SHAPED CAPACITOR STRUCTURES

BACKGROUND OF THE INVENTION

1. Field of the Invention

The present invention relates to a method for fabricating a dynamic random access memory (DRAM) and, more particularly, to an efficient method for fabricating crown-shaped capacitor structures for DRAMs using self aligned spacers.

2. Discussion of Related Art

A DRAM memory typically comprises a transistor and a capacitor. Binary information (e.g., a 0 or 1) is stored in the capacitor in the form of an electric charge. Capacitors do not store electric charges perfectly and lose their charge if not refreshed on a regular basis, such as every 2 ms. The capacitors, however, allow information (in the form of electrical charges) to be quickly stored and accessed.

FIG. 1 illustrates a typical DRAM cell 100. The DRAM cell 100 of FIG. 1 comprises a metal oxide semiconductor field effect transistor (MOSFET) 102, and a capacitor 104. A word line is connected to the gate G of the MOSFET 102. A bitline is connected to the source S of the MOSFET 102. The capacitor 104 is connected to the drain D of the MOSFET.

The state of the DRAM cell 100 is determined by whether or not the capacitor 104 is holding a charge. The DRAM cell is addressed (i.e., activated) by the word line. When the DRAM cell is activated, it may be read or written into. The DRAM cell 100 is read by using the bitline to determine whether a voltage appears at the source S, indicating the presence or absence of a charge stored in the capacitor 104. The DRAM cell is written into by using the bitline to add or remove charge from the capacitor 104.

As DRAM technology advances, the chip area used for one DRAM cell is becoming smaller. This permits more DRAM cells per unit area, resulting in a memory array storing more information in the same area than was possible in previous memory arrays. As the chip area decreases, however, it becomes increasingly difficult to fabricate a capacitor having sufficient capacitance to store a charge for a sufficient time.

Two methods may be used to increase the capacitance of a DRAM cell capacitor. One method is to decrease the effective dielectric thickness of the capacitor; the other method is to increase the effective capacitor surface area. It is expected that future DRAM cells will rely heavily on the quality and storage capacity of ultra thin dielectric materials that are sandwiched between two heavily doped polysilicon and/or silicon electrodes. However, higher capacitance values cannot be obtained by using very thin dielectric material without seriously degrading the device retention time (that is, the time between refreshes). This is because films thinner than 50 Ångstroms present excessive leakage current due to direct carrier tunneling. Therefore, in order to design smaller DRAM cells, it is desirable to increase the surface area of the DRAM cell capacitor to result in a capacitance capable of storing a charge for a sufficient time. Designing such a DRAM cell is challenging because of the conflicting design characteristics: the overall cell size is preferably minimized while the capacitor surface area is preferably maximized.

FIG. 2 illustrates a prior art DRAM cell 200 described in U.S. Pat. No. 5,185,282 issued to Lee et al. The DRAM cell 200 comprises a MOSFET 202 and a capacitor 204, both formed on a silicon substrate 206 having a first conductivity type (i.e., p-type). The MOSFET 202 comprises the source 208 and drain 210 regions, which regions are separated by a channel 212. The source and drain regions 208, 210 have a conductivity type opposite to that of the substrate 206 (i.e., n-type). A polysilicide bitline 214 directly contacts the source region 208. A bitline oxide layer 216 and a nitride layer 218 are disposed on top of the bitline 214. The bitline oxide layer includes spacers 216A, 216B which cover the sides of the bitline.

A gate 220 is formed from a first layer of conducting polysilicon material (Poly-1) and is separated from the surface of the substrate 206 by a gate oxide layer 222. An oxide layer 224 is on top of the gate 220. Oxide spacers 224A, 224B cover the sides of the gate. Field oxide regions 226 are located in the substrate 206 and separate adjacent DRAM cells.

The capacitor 204 sits on top of the drain region 210. The capacitor 204 has a first electrode 230 formed by a conducting polysilicon material (Poly-2), a thin dielectric layer 232 which may be, for example, silicon nitride film/oxide film (NO) or oxide film/silicon nitride film/oxide film (ONO), and a second electrode 234 which is formed from a layer of conducting polysilicon material (Poly-3). The capacitor contacts the drain region 210 in a space called the contact hole 236. The capacitors form a crown-shaped region over the DRAM cell.

The DRAM cell of FIG. 2 is fabricated by the following process:

1. Deposit a pad oxide film and silicon nitride film on the substrate 206. These films are masked, and the unmasked portions are etched away to expose areas of the substrate. Boron is implanted on the substrate and the substrate is re-oxidized to create field oxide (FOX) regions 222. The pad oxide and silicon nitride films are removed.

2. The gate oxide 222 and Poly-1 220 are deposited. The Poly-1 layer is doped to a particular conductivity, and the oxide layer 224 is deposited over the doped Poly-1. These layers are masked and etched to form the gate region. The oxide layer is re-grown and anisotropically etched using the reactive ion etching (RIE) method to form spacers 224A, 224B on the side of the Poly-1 layer.

3. The exposed portion of the substrate 206 (i.e., the portion not below the gate) is ion implanted to create the source and drain regions 208, 210. A polysilicon layer is deposited, doped, and processed to become polysilicide. This layer is subsequently used to form the polysilicide bitline 214. The bitline oxide layer 216 is deposited over the polysilicide layer. These layers are masked and etched to define the bitline 214 contacting the source region 208. The bitline oxide layer 216 is re-grown and anisotropically etched using the RIE method to form spacers on the sides of the bitline 214. The nitride blanket 218 is then deposited over the entire cell. The nitride blanket 218 is used as an etch-stop for the next step.

4. The nitride blanket is masked and etched to leave nitride over the bitline 214 and part of the gate region. An oxide film is deposited over the cell. This oxide film is patterned using photolithographic techniques and etched to form an oxide grid in which the contact hole 236 is formed. The oxide grid is patterned using lift off or multi-layer resist, over exposure, or advanced lithographic technique. This grid also defines the crown shape that the capacitor will take when formed.

5. A layer of polysilicon (Poly-2) is deposited over the entire grid to create the first capacitor electrode 230. The spaces defined by the grid are filled with photoresist and the top portion of the Poly-2 layer is etched back to isolate adjacent capacitors from one another. The oxide film is etched away, and the capacitor electrode is doped to a particular conductivity. The capacitor dielectric 232 is deposited over the doped capacitor electrode 230 and a third polysilicon layer (Poly-3) is deposited over the dielectric 232 to form the second capacitor electrode 234.

In this way, a DRAM having a crown-shaped capacitor is fabricated.

It is an object of the present invention to provide a DRAM having a crown-shaped capacitor fabrication method that is more efficient than the prior art methods.

It is another object of the present invention to provide a DRAM having a crown-shaped capacitor that does not have a nitride layer over the bitline.

SUMMARY OF THE INVENTION

These and other objects of the present invention are achieved by a unique and efficient method for fabricating a DRAM having a crown-shaped capacitor structure. The DRAM has a crown-shaped capacitor structure and is formed on a substrate having a first conductivity type (i.e., p-type) and preferably has the following structure. Portions of the substrate are doped to have a conductivity type opposite that of the substrate (i.e, n-type) to form drain and source regions. A gate is formed between the drain and source regions having a gate oxide adjacent the substrate, a first polysilicon region (Poly-1), tungsten silicide layer, an oxide layer, and a $Si_yN_x$ layer, respectively, on the gate oxide. $Si_yN_x$ spacers cover the sides of the gate regions. Above the oxide layer are tetetraethylorthosilicate (TEOS) and borophosphosilicate (BPSG) layers. A second polysilicon layer (Poly-2) is patterned to form a bitline which contacts the source region. A layer of tungsten silicide, oxide, and $Si_yN_x$ are formed on top of the bitline. $Si_yN_x$ spacers surround the bitline. A crown-shaped capacitor contacts the drain region. The crown-shaped capacitor comprises two polysilicon electrodes (Poly-3, Poly-4) separated by a thin dielectric layer.

The DRAM is fabricated as follows:

1. FOX regions are defined in the substrate to separate adjacent cells.
2. For each cell, the gate is created using a first polysilicon layer (Poly-1) and, using the gate as a mask, a first low-doped conductive region is made in the substrate to form a first portion of a lightly doped region.
3. Gate spacers are created on the sides of the gate, and a second highly-doped conductive region is made on top of the first low-doped conductive region to form a second portion of a lightly doped region. These lightly doped regions (lightly-doped drains or LDDs) subsequently form the DRAM source and drain regions.
4. The cell is covered with TEOS and BPSG and masked and etched to expose the source region.
5. The bitline is created using a second polysilicon layer (Poly-2), which contacts the exposed source region. Bitline spacers are formed on the sides of the bitline.
6. The entire cell is covered with BPSG and the cell is masked to form a grid along the bitlines and the edges of the cells. The BPSG and TEOS are then etched away which, using the bitline spacers and gate spacers for alignment, exposes the drain region. This grid defines the crown-shape that the capacitor will take when formed.
7. A third polysilicon layer (Poly-3) is deposited over the entire cell—including the grid and the exposed drain region—and etched to create the first capacitor electrode.
8. A dielectric is deposited over the electrode and another layer of polysilicon is deposited over the dielectric to form the second capacitor electrode.

This method fabricates the DRAM cell using only five masking steps. Thus, the process is more efficient than the prior art methods for fabricating other DRAMS having crown-shaped capacitors. Also, the drain is exposed at the same time that the grid is formed using the spacers for alignment. This avoids precise masking or photolithography to expose this layer.

BRIEF DESCRIPTION OF THE DRAWINGS

The present invention is described with reference to the following figures.

DETAILED DESCRIPTION OF PREFERRED EMBODIMENT

Figure 1:
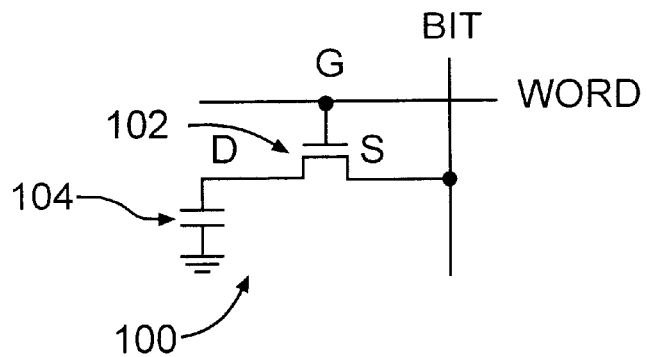
FIG. 1 is a schematic diagram illustrating a DRAM.
Figure 2:
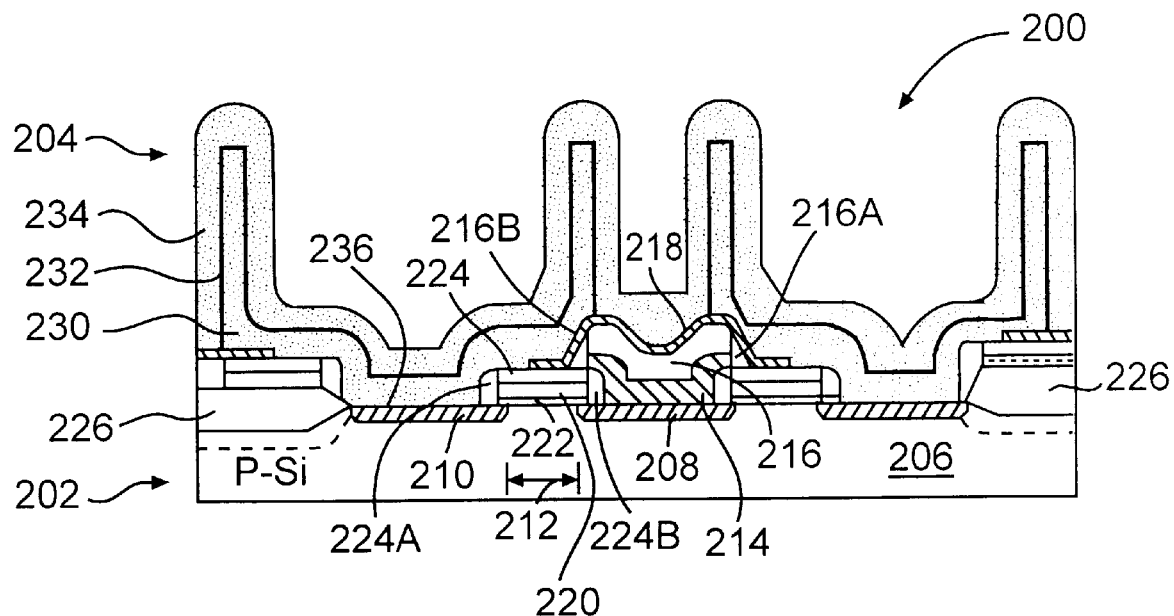
FIG. 2 is a cross-sectional view of a prior art DRAM having a crown-shaped capacitor.
Figure 3A:
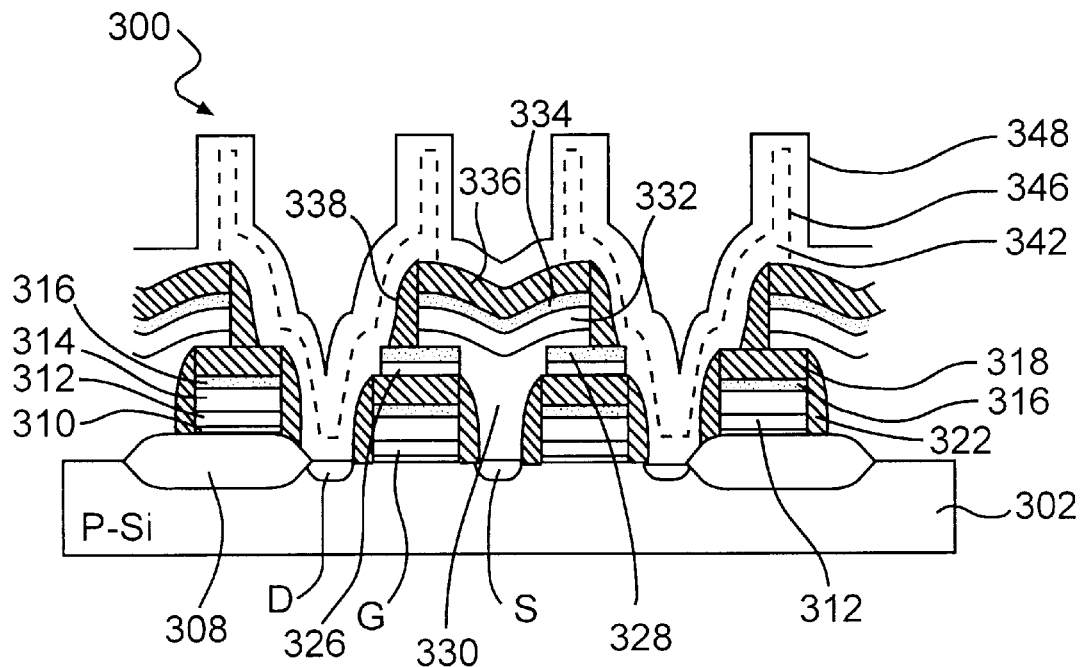
FIG. 3A is a cross-sectional view of a DRAM having a crown-shaped capacitor according to the present invention.

FIG. 3A is a cross-sectional view of a semiconductor device having an array of memory cells, such as a DRAM, a crown-shaped capacitor according to the present invention. FIG. 3A shows two DRAM cells sharing a single source. A dashed line indicates a structure of a single cell. As seen in FIG. 1, each cell comprises transistors and a capacitor. The cell is formed on a p-type silicon substrate 302. Field oxide (FOX) regions 308 are defined in the substrate 302 to separate DRAM cells. Drain and source regions (D,S) are formed in the substrate by forming n-type conductivity regions. On the substrate surface and between the drain and source, a gate region (G) is formed. The gate region comprises a gate oxide 310, a first polysilicon layer (Poly-1) doped to have a n-type conductivity 312, a tungsten silicide (WSi) layer 314, an oxide layer 316, and an $Si_yN_x$ layer 318. $Si_yN_x$ (such as $Si_3N_4$) spacers 322 cover the sides of the gate regions. Above the gate region are layers of TEOS 326 and BPSG 328. A second polysilicon layer (Poly-2) having an n-type conductivity 330 contacts the source region and forms the bitline. Layers of WSi 332, oxide 334, and $Si_yN_x$ 336 cover the bitline. The exposed portions of the bitline are covered with $Si_yN_x$ spacers 338. Crown-shaped capacitors contact the drain region. The crown-shaped capacitors comprise a third polysilicon layer (Poly-3) 342 doped to an n-type conductivity, a thin dielectric layer 346, such as NO or ONO, and a fourth polysilicon layer (Poly-4) 348 doped to a n-type conductivity.

Figure 3B:
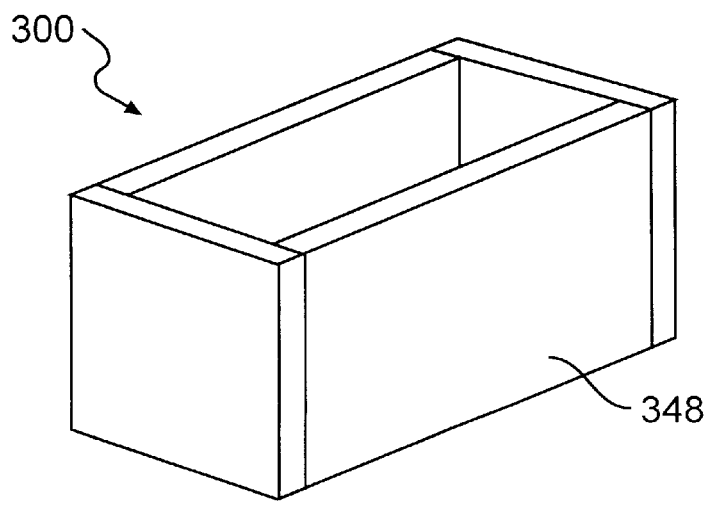
FIG. 3B is an isometric view of a crown-shaped capacitor of the DRAM cell of FIG. 3A.

FIG. 3B is an isometric view of the DRAM cell of FIG. 3A. The Poly-4 layer (second capacitor electrode) 348 is visible. The cavity defined by the capacitor is also visible.

FIGS. 4A–4K are cross-sectional views illustrating a preferred method manufacturing the DRAM cell according to the present invention.

Figure 4A:
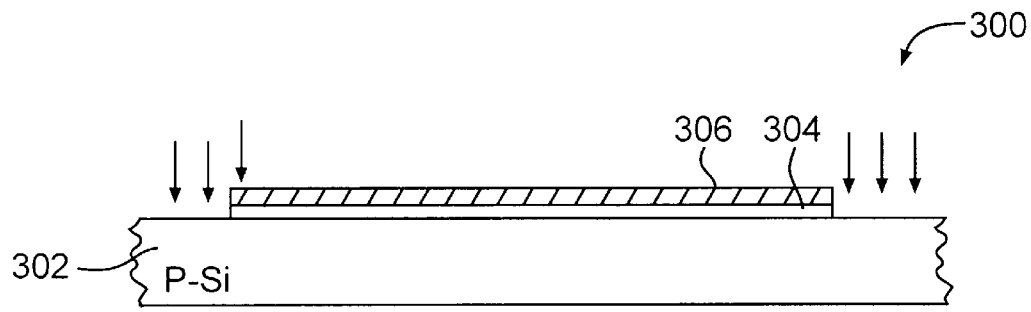
FIGS. 4A–4K are cross-sectional views illustrating a preferred manufacturing process according to the present invention.

FIG. 4A shows a p-type silicon 302. A person skilled in the art readily understands that an n-type substrate could also be used. If an n-type substrate is used, the conductivity types of the different conductive components have a conductivity opposite that described here.

A pad oxide film 304 having a thickness in the range of 100–300 Å is thermally grown on the substrate 302 using either the dry oxidation or wet oxidation method. Other methods may also be used. A silicon nitride ($Si_yN_x$) film 306 having a thickness in the range of 400–2000 Å is deposited over the pad oxide film 304, using the Low Pressure Chemical Vapor Deposition (LPCVD) method. Other methods may also be used.

Using photolithographic techniques, the pad oxide film 304 and nitride film 306 are removed in selected locations to expose the substrate.

Figure 4B:
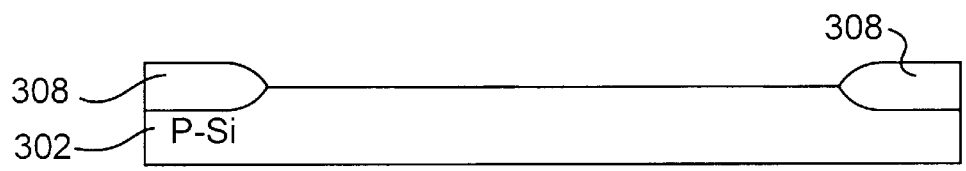

FIG. 4B shows that a field oxide region 308 (FOX) is grown at the location of the implant. The FOX is preferably grown using the thermal oxidation method. The silicon nitride film is etched away using wet etching and the pad oxide film is removed with buffered HF.

Figure 4C:
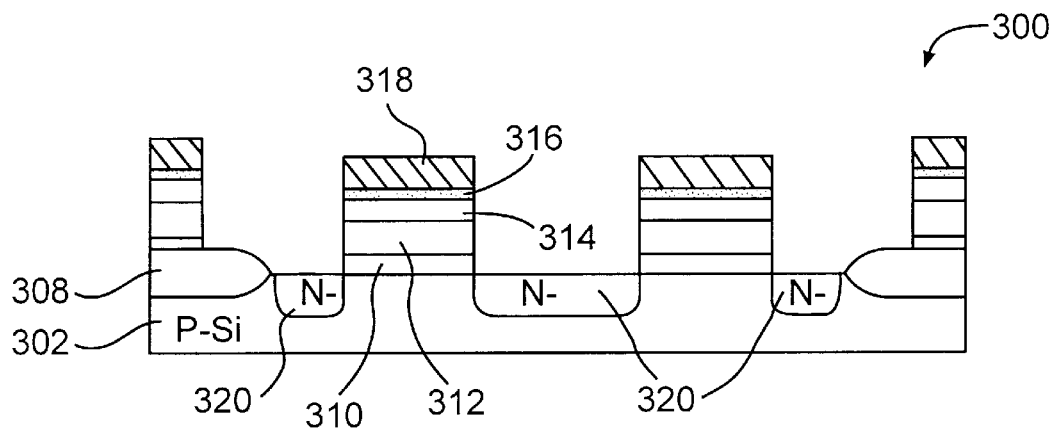

FIG. 4C shows a layer of gate oxide film 310 having a thickness in the range of 60–150 Å is grown on the substrate using the thermal oxidation method. A layer of polysilicon (Poly-1) 312 having a thickness in the range of 500–1500 Å is deposited on the gate oxide film using the LPCVD method. The Poly-1 layer is doped to an n-type conductivity type using pre-mixed doping gas sources, such as $AsH_3$ or $PH_3$, in chemical vapor deposition (CVD). A layer of tungsten silicide (WSi) having a thickness in the range of 500–1000 Å is deposited on the doped Poly-1 layer using the CVD method. An oxide layer 316 having a thickness in the range of 100–1000 Å is grown on top of the WSi layer by thermal oxidation or CVD methods. An insulating layer of $Si_yN_x$ 318 (such as $Si_3N_4$) or SiON, having a thickness in the range of 400–1500 Å, and preferably 1000 Å, is deposited on the oxide layer 316 using, for example, CVD. The oxide layer 316 is provided for stress relief because differences in thermal expansions between $Si_yN_x$ and WSi prevent the $Si_yN_x$ from being deposited directly onto WSi.

These layers are masked and etched away to form regions which make up the gate of the DRAM cell. The substrate exposed by the etching is doped with phosphorous at an energy of 30–50 keV and a flux density of 1–5E13 $cm^{-2}$ to define n– regions 320 between the gate regions.

Figure 4D:
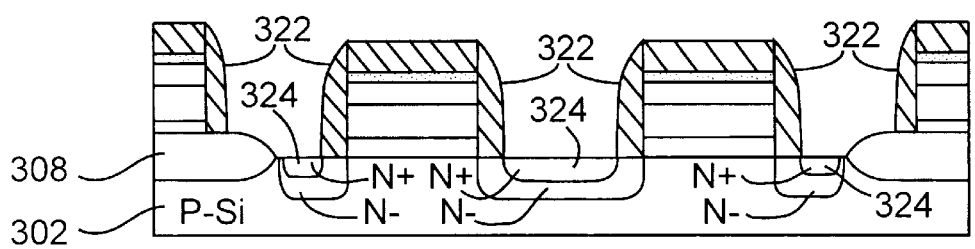

FIG. 4D shows that a second layer of $Si_yN_x$ is deposited over the entire cell having a thickness of the range 400–1500 Å and preferably 800 Å. This layer is anisotropically etched to form spacers 322 on the sides of the gate regions. Using the gate region and gate spacers 322 as spacers, the substrate exposed by the etching is doped with As at an energy of 30–60 keV and a flux density of 1E15–1E16 $cm^{-2}$ to define n+ regions 324 in the upper portion of the n– regions 320. This n–/n+ structure is called a lightly doped structure (a lightly doped drain or LDD). (Of course, if a lightly doped structure is not desired, a n+ region may be formed without first forming an n– region.) As seen below, these lightly doped structures make up the drain and source regions of the DRAM cell.

Figure 4E:
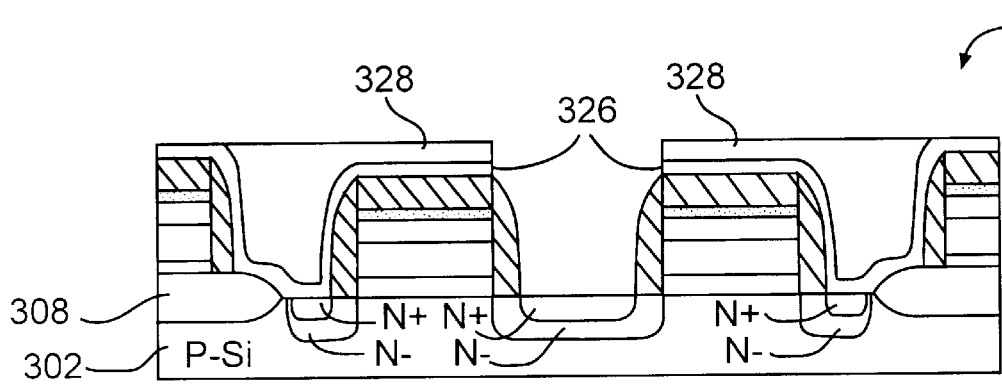

FIG. 4E shows a layer of tetraethylorthosilicate (TEOS) 326 having a thickness in the range of 500–5000 Å and deposited using the CVD method. The cell is filled to the top with borophosphosilicate (BPSG) 328. Using photolithography, these layers are masked and etched back to expose the source region.

Figure 4F:
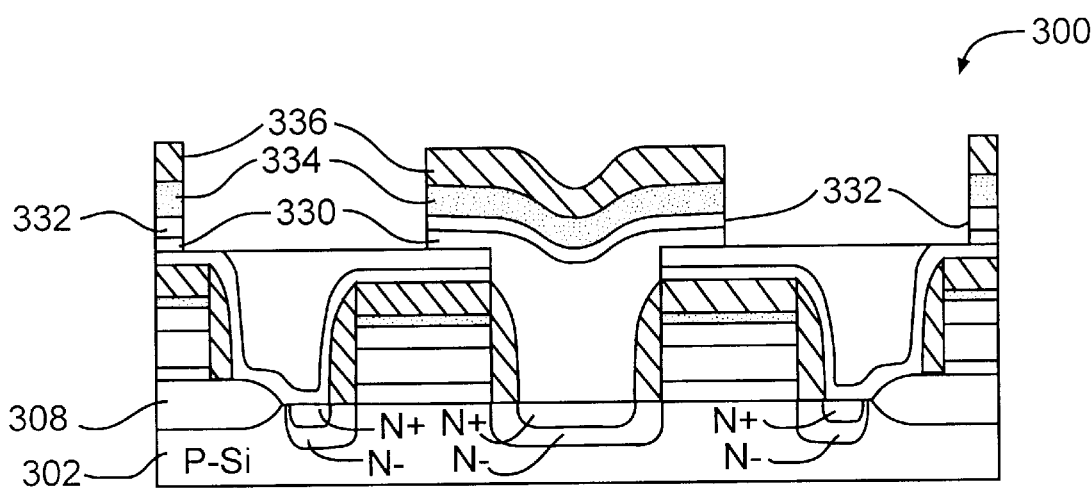

FIG. 4F shows a second polysilicon layer (Poly-2) 330 deposited over the entire cell, including the exposed source region. The Poly-2 layer is doped with in-situ doping CVD methods to make it an n-type conductivity. The Poly-2 layer contacts the exposed source region. A layer of tungsten silicide (WSi) 332 having a thickness in the range of 500–2000 Å is deposited on the doped Poly-2 layer using the CVD method. An oxide layer 334 having a thickness in the range of 100–1000 Å is grown on top of the WSi layer. A layer of $Si_yN_x$ 336 having a thickness in the range of 500–2000 Å is deposited on the oxide layer 316 using, for example, CVD. These layers are masked and etched back to define a bitline contacting the source region.

Figure 4G:
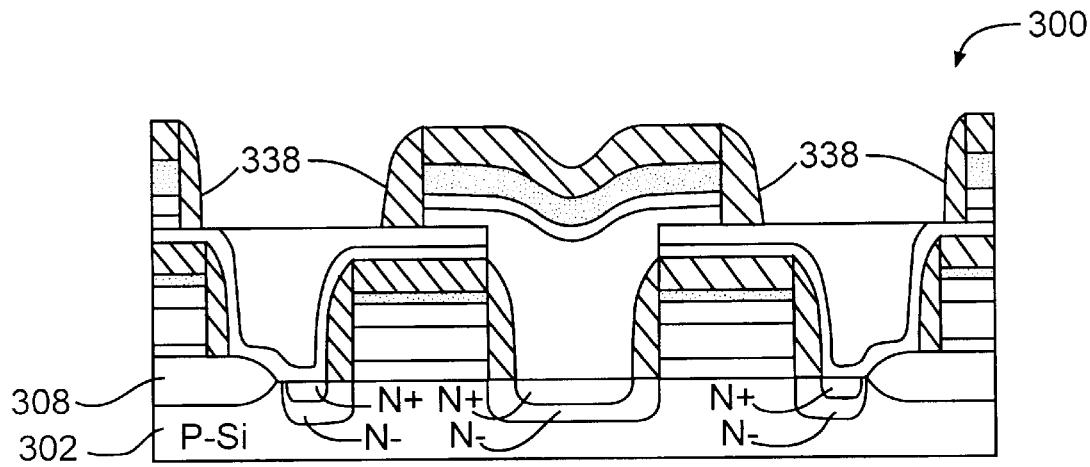

FIG. 4G shows a second layer of $Si_yN_x$ is deposited over the entire cell having a thickness of the range 400–1500 Å. This layer is anisotropically etched to form spacers 338 on the sides of the bitline.

Figure 4H:
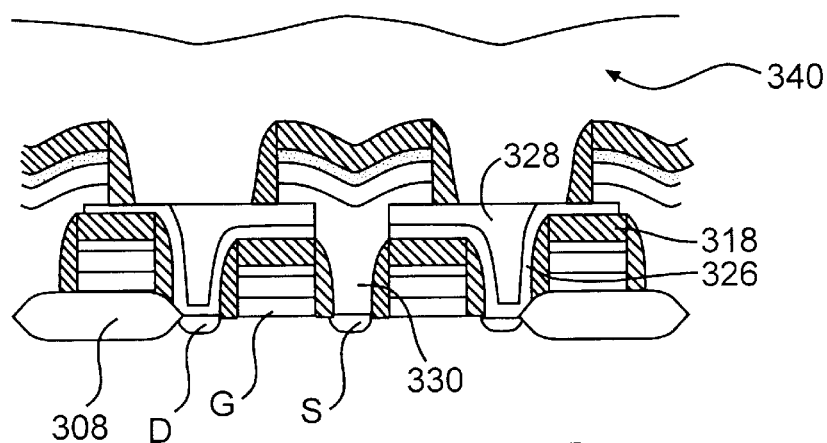

FIG. 4H shows BPSG 340 deposited over the entire cell using the CVD method and reflowed. (Note that for clarity, FIGS. 4H–4K omit some cell layers. Gate oxide 310, for example, is not shown.) The BPSG is masked and the BPSG and underlying TEOS are etched using a highly selective oxide etching, such as selective dry etching in a high-density plasma (described in Givens, et al., "Selective Dry Etching In A High Density Plasma for 0.5 $\mu$m Complementary Metal-Oxide-Semiconductor Technology," J. Vac. Sci. Tech., January/February 1994 pp. 427–432), or a high selectivity silicon nitride etch (described in Reinhardt, et al., "High Selectivity Silicon Nitride Etch for Sub-Half Micron Devices"), to form an oxide grid. This grid defines the crown-shape that the capacitor will take when formed. Note that the grid does not cover the drain region. Thus, the selective oxide etching forms self-aligned contacts to the drain region.

Figure 4I:
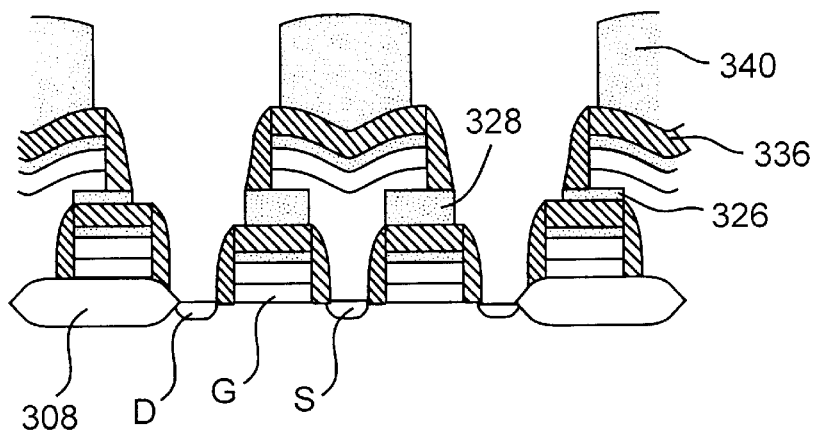

FIG. 4I shows the grid and self-aligned contacts created when the exposed BPSG and TEOS are etched away. Note that the bitline spacers 338 act as a mask so that the BPSG and TEOS covered by the bitline spacers 338 are not etched away. Also, the bitline spacers 338 and gate spacers 322 self align the drain region exposed when the BPSG and TEOS are etched away to form the grid.

Figure 4J:
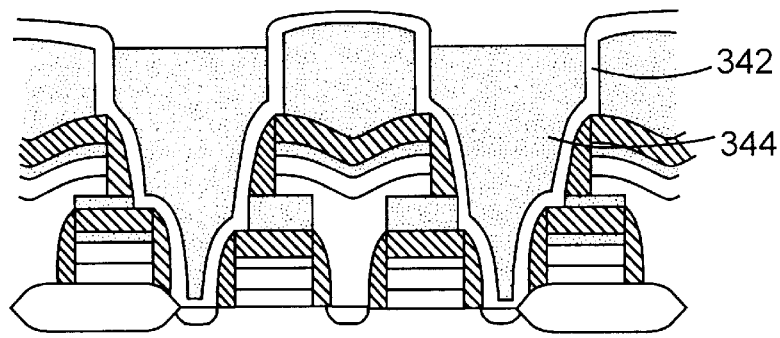

FIG. 4J shows that a third polysilicon layer (Poly-3) 342 having a thickness of the range 300–1000 Å is deposited onto the entire cell. The Poly-3 layer is doped to an n-type conductivity using an in-situ doping CVD method. This Poly-3 layer will form one of the capacitor electrodes. The cavities formed within the Poly-3 layer are filled with BPSG, spin-on-glass (SOG), or photoresist (PR) 344. This BPSG, SOG, or PR is partially etched back to expose the top of the Poly-3 layer.

Figure 4K:
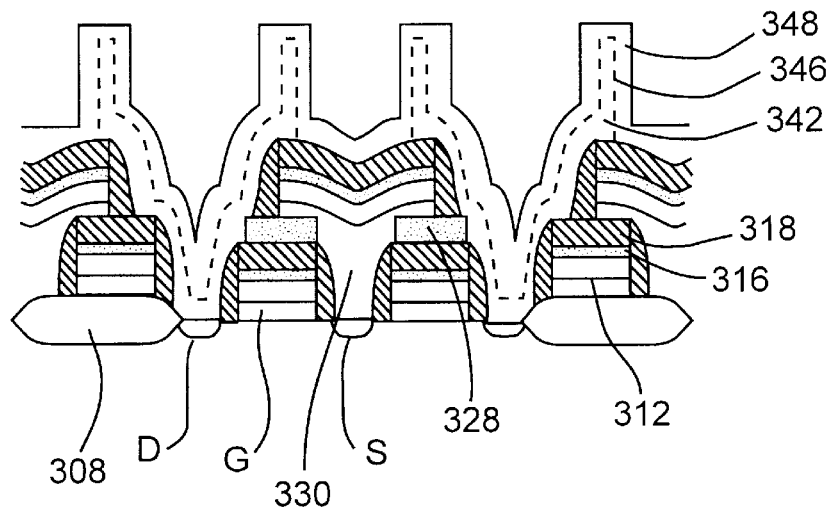

FIG. 4K shows that the exposed portions of the Poly-3 layer 342 are etched back using, for example, selective polysilicon etching. This etching isolates the Poly-3 layer 342 into a number of separate capacitor plates. The BPSG, SOG, or PR filling the cavity is completely removed, including the BPSG 340 forming the grid by another selective oxide etching. A thin dielectric layer, for example, NO or ONO, having a thickness range of 45–100 Å is deposited onto the surface of the doped Poly-3 layer to form the capacitor dielectric layer.

A fourth polysilicon layer (Poly-4) 348 having a thickness range of 500–2000 Å is deposited onto the dielectric layer using the CVD method. This Poly-4 layer is doped to a conductivity type using an in-situ doping source.

This cell manufacturing process is completed using well-known back end processes not described here.

This process forms the memory cell capacitor having a crown-shaped capacitor of FIG. 3. The memory cell is manufactured using only five masking steps. Thus, the process is more efficient than the prior art method for fabricating other memory cells having crown-shaped capacitors.

Figure 5:
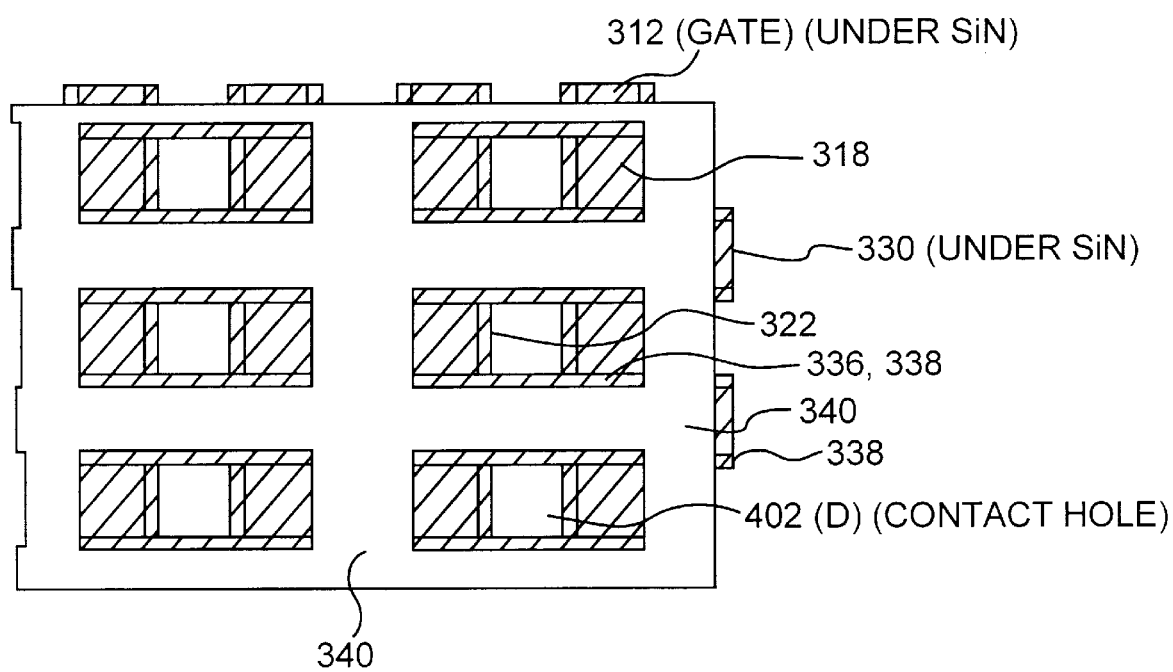
FIG. 5 is a top plan view of a number of DRAM cells of FIG. 4I.

FIG. 5 shows a top view of the DRAM cell of FIG. 4I. The grid 340 sits on top of the bitlines 330 (with the $Si_yN_x$ layer 336 between them). The contact hole 402, which is the exposed portion of the drain region, is the area which contacts the capacitor. The various layers and spacers are also visible.

An improved method for fabricating a DRAM cell having a crown-shaped capacitor is disclosed. The method requires one less masking step than the prior art fabrication method and therefore is an improvement over it. This efficient method is partially a result of not having a nitride layer above the bitline.

The above described embodiments of the invention are intended to be illustrative only. Numerous alternative embodiments may be devised by those skilled in the art without departing from the spirit and scope of the following claims.

We claim:

1. A method of fabricating a semiconductor device having a memory cell having a cell capacitor, comprising the steps of:
   a. creating a gate having a first conductivity type on a substrate having a second conductivity type opposite the first conductivity type, said gate having a gate spacer formed on sidewall thereof;
   b. using the gate as a mask, creating in the substrate a source region and a drain region, each having the first conductivity type;
   c. covering the cell with etchable material and etching the etchable material to expose the source region;
   d. forming a bit line in contact with the exposed source region, said bit line having a bitline spacer formed on sidewall thereof;
   e. covering the entire cell with an etchable material and etching the etchable material using a selective etch simultaneously forming a grid along the bit line and edges of the cell and exposing the drain region by using said gate spacer and bitline spacer to self align the exposed drain region when the etchable material is being etched;
   f. forming a first capacitor plate on the grid and in contact with the drain region;
   g. depositing a dielectric over the first capacitor plate; and
   h. forming a second capacitor plate over the dielectric.

2. The method of claim 1, wherein the step of creating the gate further comprises the steps of:
   a. growing a layer of gate oxide film on the substrate;
   b. depositing a first polysilicon layer (Poly-1) on the gate oxide layer;
   c. doping the Poly-1 layer to the first conductivity type;
   d. depositing a layer of tungsten silicide (WSi) on the doped Poly-1 layer;
   e. depositing an oxide layer on the WSi layer;
   f. depositing a $Si_yN_x$ layer on the oxide layer; and
   g. etching the gate oxide, Poly-1, WSi, oxide, and $Si_yN_x$ layers to form the gate.

3. The method of claim 2, further comprising the steps of:
   a. after the etching step, depositing a second $Si_yN_x$ layer over the DRAM cell; and
   b. anisotropically etching the second $Si_yN_x$ layer to form a spacer on sides of the gate.

4. The method of claim 3, wherein the step of creating the source and drain regions further comprises the steps of:
   a. after the step of etching to form the gate, using the gate as a mask, forming a lightly doped region of the first conductivity type in substrate; and
   b. after the step of forming the spacer on sides of the gate, using the spacer as a mask, forming a highly doped region of the first conductivity type in an upper part of the lightly doped region.

5. The method of claim 1, wherein the step of forming the bitline further comprises the steps of:
   a. depositing a second polysilicon layer (Poly-2) over the DRAM cell and contacting the exposed source region;
   b. doping the Poly-2 layer to the first conductivity type;
   c. depositing a layer of tungsten silicide (WSi) on the doped Poly-2 layer;
   d. depositing an oxide layer over the WSi layer;
   e. depositing a $Si_yN_x$ layer on the oxide layer; and
   f. etching the Poly-2, WSi, oxide, and $Si_yN_x$ layers to form the bitline.

6. The method of claim 5, further comprising the steps of:
   a. after the etching step, depositing a second $Si_yN_x$ layer over the DRAM cell; and
   b. anisotropically etching the second $Si_yN_x$ layer to form a spacer on sides of the bitline.

7. The method of claim 1, wherein the step of forming the first capacitor plate further comprises the steps of:
   a. depositing a third polysilicon layer (Poly-3) over the entire cell;
   b. doping the Poly-3 layer to the first conductivity type;
   c. filling a cavity formed by the Poly-3 layer with an etchable material;
   d. partially etching the etchable material to expose a top portion of the Poly-3 layer; and
   e. etching the exposed portion of the Poly-3 layer.

8. The method of claim 1, wherein the step of forming the second capacitor plate further comprises the steps of:
   a. depositing a fourth polysilicon layer (Poly-4) over the entire cell; and
   b. doping the Poly-4 layer to the first conductivity type.

9. A method of forming a grid in a semiconductor device having a memory cell having a crown-shaped capacitor, comprising the steps of:
   a. forming a semiconductor cell having a gate, source, and drain, said gate having a gate spacer formed on sidewall thereof;
   b. forming a bitline in contact with the source, said bitline having a bitline spacer formed on sidewall thereof;
   c. covering the cell with an etchable material;
   d. masking the etchable material to define a grid-shaped region; and
   e. etching the masked etchable material simultaneously forming the grid-shaped region and exposing the drain by using said gate spacer and bitline spacer to self align the exposed drain region when the etchable material is being etched.

10. The method of claim 9, wherein the etchable material is BPSG and TEOS.

11. A method for fabricating memory cells each having a crown-shaped capacitor, comprising;
   forming a semiconductor substrate having a plurality of isolation regions therein, any two consecutive isolation regions defining the memory cell region;

forming a gate oxide layer on said substrate not covered by the isolation regions;

forming a first polysilicon layer on said gate oxide layer;

forming a first silicide layer on said first polysilicon layer;

forming a first oxide layer on said first silicide layer;

forming a first silicon nitride layer on said first oxide layer;

patterning to etch said gate oxide layer, said first polysilicon layer, said first silicide layer, said first oxide layer, and said first silicon nitride layer, so that two gate regions are defined in each of said memory cells, wherein space between these two gate regions is defined as a source region, and space between one gate region and its consecutive isolation region is defined as a drain region;

doping said substrate using said gate regions as a mask;

forming a first silicon nitride spacer on sidewall of each of the gate regions;

doping said substrate using said gate regions and said first silicon nitride spacer as a mask;

forming a tetraethylorthosilicate layer on the gate regions and the substrate;

forming a borophosphosilicate layer on said tetraethylorthosilicate layer;

patterning to etch said tetraethylorthosilicate layer and said borophosphosilicate layer to expose the source region;

forming a second polysilicon layer on said exposed source region and said borophosphosilicate layer;

forming a second silicide layer on said second polysilicon layer;

forming a second oxide layer on said second silicide layer;

forming a second silicon nitride layer on said second oxide layer;

patterning to etch said second polysilicon layer, said second silicide layer, said second oxide layer, and said second silicon nitride layer, so that the etched second polysilicon layer, second silicide layer, second oxide layer, and second silicon nitride layer remain over the source region as a bitline region;

forming a second silicon nitride spacer on sidewall of the bitline region;

forming a first sacrificial layer over said bitline region, said tetraethylorthosilicate layer and said borophosphosilicate layer;

patterning to anisotropically etch said first sacrificial layer, said tetraethylorthosilicate layer and said borophosphosilicate layer using a single lithographic mask, so that an etched first sacrificial region leaves on and within a top surface of each bitline region and the drain region is exposed simultaneously, wherein said etching the first sacrificial layer is performed using said second silicon nitride spacer and said first silicon nitride spacer to self align the exposed drain region, any two consecutive first sacrificial regions defining a cavity region;

forming a third polysilicon layer on said sacrificial region, said bitline region, said gate regions, and the substrate;

filling said cavity region with second sacrificial material to a level approximately equal to top surface of said first sacrificial region;

etching back said third polysilicon layer and said second sacrificial material until the first sacrificial region is exposed;

removing said first sacrificial regions and said second sacrificial material in the cavity;

forming a dielectric layer on said third polysilicon layer; and forming a fourth polysilicon layer on said dielectric layer.

* * * * *